(12) United States Patent
An et al.

(10) Patent No.: US 7,969,246 B1
(45) Date of Patent: Jun. 28, 2011

(54) SYSTEMS AND METHODS FOR POSITIVE AND NEGATIVE FEEDBACK OF CASCODE TRANSISTORS FOR A POWER AMPLIFIER

(75) Inventors: Kyu Hwan An, Irvine, CA (US); Yunseo Park, Norcross, GA (US); Chang-Ho Lee, Marietta, GA (US)

(73) Assignee: Samsung Electro-Mechanics Company (KR)

( * ) Notice: Subject to any disclaimer, the term of this patent is extended or adjusted under 35 U.S.C. 154(b) by 0 days.

(21) Appl. No.: 12/723,038

(22) Filed: Mar. 12, 2010

(51) Int. Cl.
  *H03F 3/04* (2006.01)
(52) U.S. Cl. ......... 330/311; 330/293; 330/283; 330/82
(58) Field of Classification Search .......... 330/311, 330/293, 283, 82
  See application file for complete search history.

(56) References Cited

U.S. PATENT DOCUMENTS

| | | | |
|---|---|---|---|
| 4,468,629 A * | 8/1984 | Choma, Jr. | 330/260 |
| 6,737,920 B2 | 5/2004 | Jen et al. | |
| 6,784,734 B2 * | 8/2004 | Amourah | 330/253 |
| 7,202,708 B2 * | 4/2007 | Luh et al. | 327/77 |
| 7,256,646 B2 * | 8/2007 | Eid et al. | 327/563 |
| 7,259,625 B2 * | 8/2007 | Sanderson | 330/253 |
| 7,415,286 B2 * | 8/2008 | Behzad | 455/553.1 |
| 2006/0057990 A1 | 3/2006 | Behzad et al. | |
| 2006/0132232 A1 | 6/2006 | Baree et al. | |

* cited by examiner

*Primary Examiner* — Patricia Nguyen
(74) *Attorney, Agent, or Firm* — Sutherland Asbill & Brennan LLP

(57) ABSTRACT

Systems and methods are provided for positive and negative feedback of cascode transistors for a power amplifier. The systems and methods may include a first cascode stage comprising a first common-source device and a first common-gate device; a second cascode stage comprising a second common-source device and a second common-gate device; a first degenerative element or block provided for the first common-source device; a second degenerative element or block provided for the second common-source device; a first positive feedback block or element that connects a first gate of the first common-source device with a second drain of the second common-source device; and a second positive feedback block or element that connects a second gate of the second common-source device with a first drain of the first common-source device.

20 Claims, 4 Drawing Sheets

SYSTEMS AND METHODS FOR POSITIVE AND NEGATIVE FEEDBACK OF CASCODE TRANSISTORS FOR A POWER AMPLIFIER

FIELD OF INVENTION

Embodiments of the invention relate generally to power amplifiers, and more particularly, to systems and methods for positive and negative feedback of cascode transistors.

BACKGROUND OF THE INVENTION

The design of linear power amplifiers for mobile applications requires high gain and linearity at the same time. More often than not, however, the gain and linearity characteristics are in trade-off relationship. An enhancement of one characteristic is achievable only at the cost of the other. Thus, the limited design range of parameters often prohibits satisfactory power amplifier design for high output power and high linearity. Therefore, the extension of design parameter range can be beneficial to power amplifier designers.

FIG. 1 illustrates a conventional cascode power amplifier having a simple stack of two transistors 101, 102. Source degeneration 106 can be used to enhance linearity of the power amplifier. Source degeneration 106 is a widely used linearization technique by providing a negative feedback path, that is, when high current flows through the cascode transistors, a high voltage can be generated across the degeneration element 106, and the gate-source voltage of the common-source transistor 101 decreases reducing the current again. However, this technique often degrades the gain of the power amplifier as well. Since the gain of power amplifiers is an important specification, it is undesirable to have excessive feedback.

BRIEF SUMMARY OF THE INVENTION

According to an example embodiment of the invention, there is a power amplifier system. The system may include a first cascode stage comprising a first common-source device and a first common-gate device; a second cascode stage comprising a second common-source device and a second common-gate device; a first degenerative element or block provided for the first common-source device; a second degenerative element or block provided for the second common-source device; a first positive feedback block or element that connects a first gate of the first common-source device with a second drain of the second common-source device; and a second positive feedback block or element that connects a second gate of the second common-source device with a first drain of the first common-source device.

According to another example embodiment, there is a feedback method for a power amplifier system. The method may include cascoding a first common-source device with a first common-gate device to provide a first cascode stage; cascoding a second common-source device with a second common-gate device to provide a second cascode stage; providing first negative feedback to the first cascode stage via a first degenerative element or block connected to the first common-source device; providing second negative feedback to the second cascode stage via a second degenerative element or block connected to the second common-source device; providing first positive feedback by connecting a first gate of the first common-source device with a second drain of the second common-source device via first positive feedback block or element; and providing second positive feedback by connecting a second gate of the second common-source device with a first drain of the first common-source device via a second positive feedback block or element.

BRIEF DESCRIPTION OF THE DRAWINGS

Figure 1:
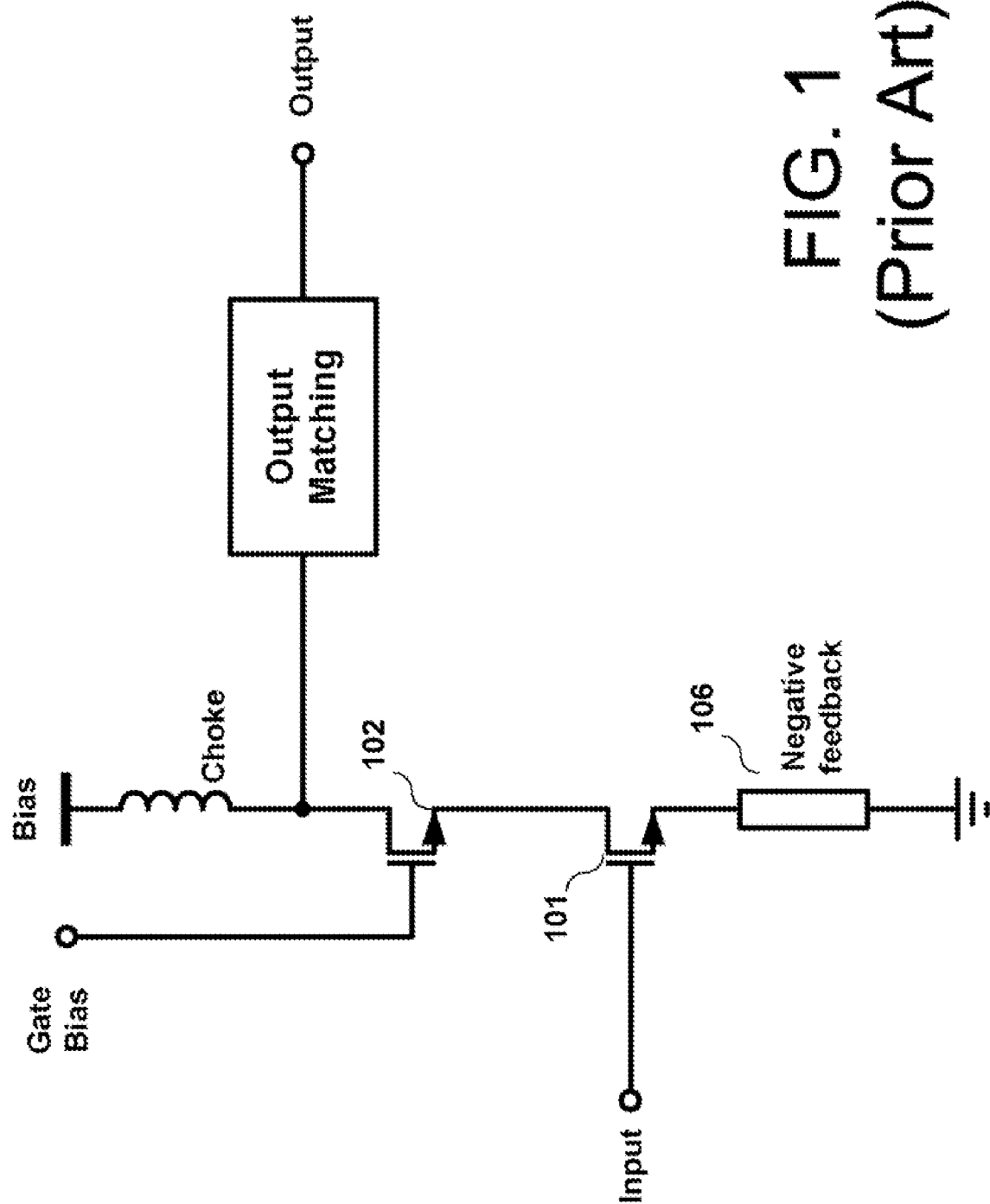

Having thus described the invention in general terms, reference will now be made to the accompanying drawings, which are not necessarily drawn to scale, and wherein:

FIG. 1 illustrates a conventional power amplifier with a negative feedback.

Figure 2:
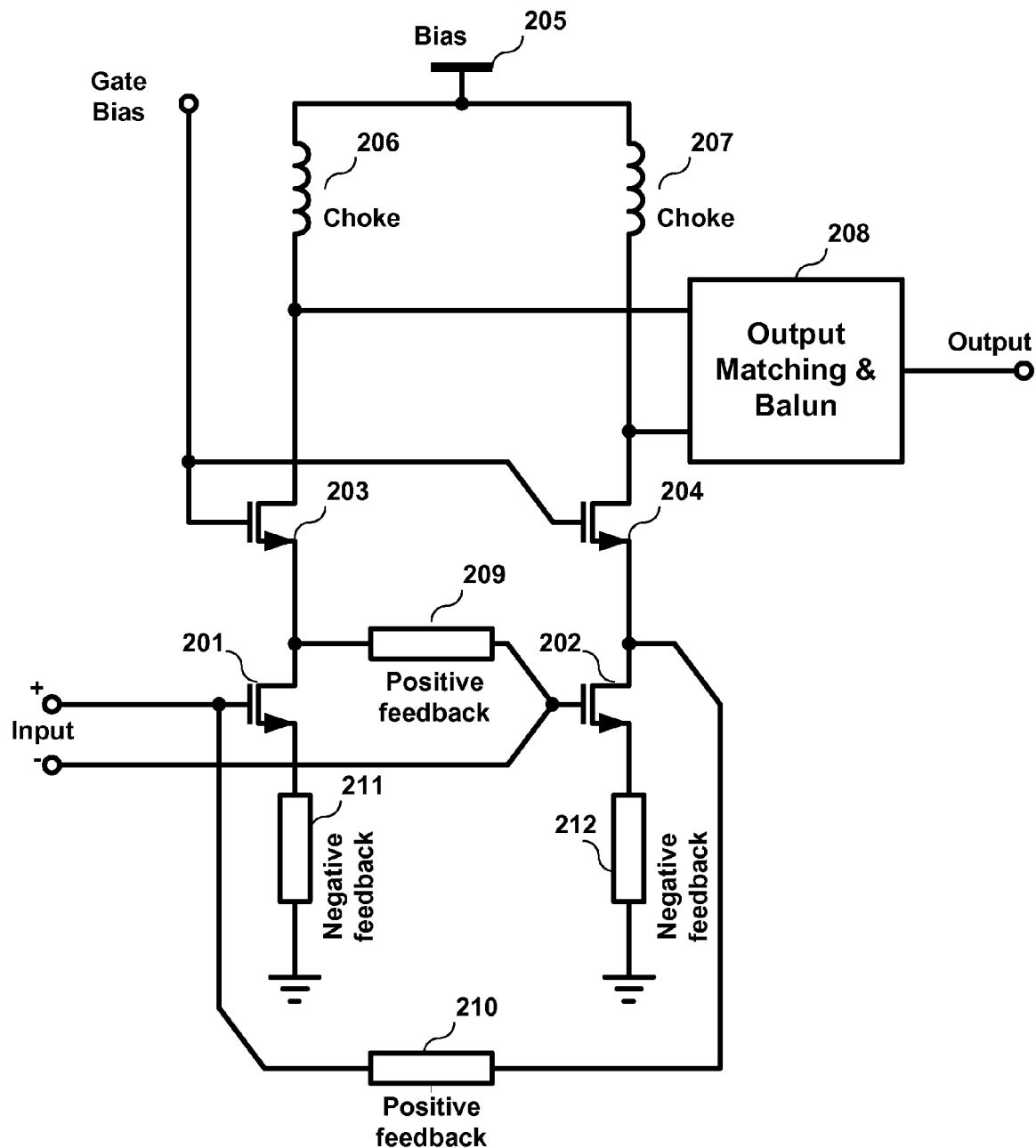

FIG. 2 illustrates an example power amplifier system having a differential topology and a combination of positive and negative feedback, according to an example embodiment of the invention.

Figure 3:
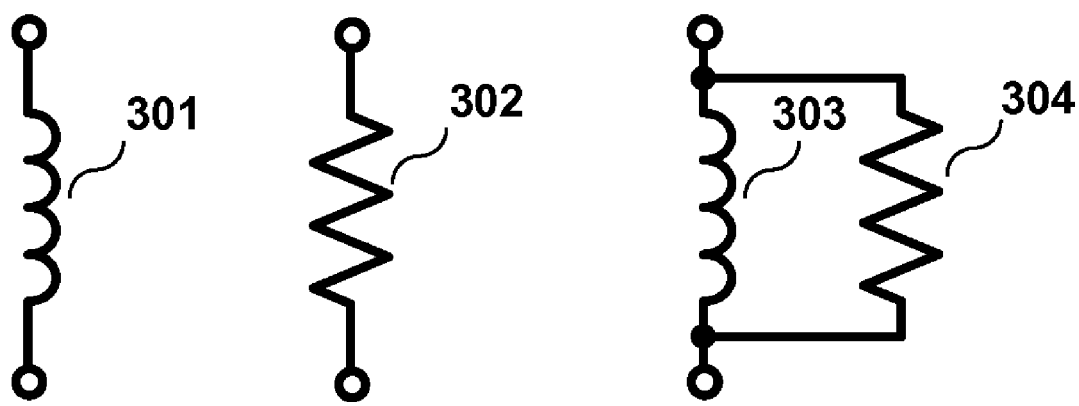

FIG. 3 illustrates example components that may be utilized for implementing a negative feedback block, according to an example embodiment of the invention.

Figure 4:
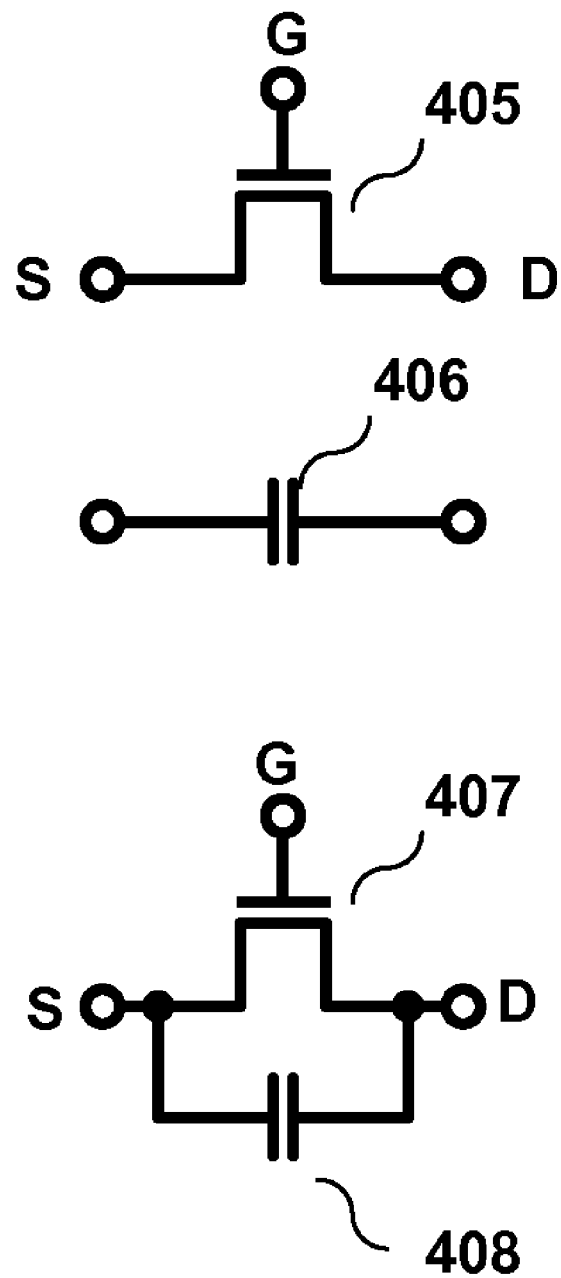

FIG. 4 illustrates example components that may be utilized for implementing a positive feedback block or element, according to an example embodiment of the invention.

DETAILED DESCRIPTION OF THE INVENTION

Example embodiments of the invention will now be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

FIG. 2 illustrates an example power amplifier system having a differential topology and a combination of positive and negative feedback, according to an example embodiment of the invention. In FIG. 2, the system may include a first cascode stage and a second cascode stage. The first cascode stage may include a common-source device (e.g., common-source transistor) 201 and a common-gate device (e.g., common-gate transistor) 203. Likewise, the second cascode stage may include a common-source device 202 and a common-gate device 204. It will be appreciated that the first and second cascode stages may be in a cascode configuration, according to an example embodiment of the invention. The respective gates of common-gate devices 203, 204 may be biased using a gate bias source 220. Likewise, the drains of the respective devices 203, 204 may be connected to a bias source 205 via respective RF chokes 206, 207. The differential system inputs may be received at the respective gates of the respective common-source devices 201, 202. The outputs of respective common-source devices 201, 202 may be provided by their respective drains to the respective common-gate devices 203, 204. More specifically, the respective sources of the respective common-gate devices 203, 204 may be inputs that receive the outputs of the respective common-source devices 201, 202. The respective outputs of the respective common-gate devices 203, 204 may then be provided to an output matching and balun block 208. In particular, block 280 may operate as a balun to convert the balanced outputs from respective common-gate devices 203, 204 to a single-ended, unbalanced output signal that is taken as the system output. In addition, block 208 may also provide for impedance matching between stages as needed or desired, according to an example embodiment of the invention.

In FIG. 2, a differential configuration may be provided such that the first cascode device 201 may be provided with a first source degenerative block or element 211 while the second cascode device 202 may be provided with a second source degenerative block or element 212 in order to provide high linearity characteristics. In addition, positive feedback blocks or elements 209, 210 (alternatively referred to as signal forward blocks or elements) may also be also be utilized. More specifically a first positive feedback block or element signal forward element 209 may cross-couple the drain (the output) of the common-source device 201 with the gate (the input) of the common-source device 202. Similarly a second positive feedback block or element 210 may connect the drain (the output) of the common-source device 202 with the gate (the input) of the common-source device 201. Thus, each cascode device 201, 203, 202, 204 may thus experience two feedback mechanisms—(1) firstly, through the negative feedback from degenerative blocks or elements 211, 212 from the respective sources, and (2) secondly, from the positive feedback from positive feedback blocks 209, 210 from the respective gates by the cross coupling described herein.

The amount of feedback for both positive and negative feedbacks provided by respective blocks or elements 209, 210, 211, 212 may be controlled by the value of feedback elements. FIG. 3 illustrates example components that may be utilized for implementing a negative feedback block or element, according to an example embodiment of the invention. As shown in FIG. 3, a negative feedback block or element such as one of blocks or elements 211, 212 may be implemented using an inductive element 301 (e.g., an inductor), a resistive element 302 (e.g., a resistor), or a combination of an inductive element 303 and a resistive element 304 either in parallel or series (not shown).

FIG. 4 illustrates example components that may be utilized for implementing a positive feedback block or element, according to an example embodiment of the invention. As shown in FIG. 4, a positive feedback block or element such as one of blocks or elements 209, 210 may be implemented using an active component 405, a capacitive component 406 (e.g., a capacitor), or a combination of an active component 407 and a capacitive component 408 either in parallel or series (not shown). In an example embodiment of the invention, the active components 405, 407 may be implemented using transistors such as such as field effect transistors (FETs) having respective sources, gates, and drains. The sources and drains of the transistors may be utilized for the illustrated connections for the positive feedback blocks or elements while the gates of the transistors may be biased accordingly. It will be appreciated that the active components 405, 407 may be operative as or include switch elements, according to an example embodiment of the invention.

It will be appreciated that a combination of negative and positive feedback may allow for a wide design range enabling both good linearity and high gain. A possible instability of positive feedback can be damped by the negative feedback, while the low gain by negative feedback can be enhanced by the positive feedback. A well optimized balance between two feedbacks may be utilized to not to lose the controllability of the desired operation, according to an example embodiment of the invention.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A power amplifier system, comprising:
   a first cascode stage comprising a first common-source device and a first common-gate device;
   a second cascode stage comprising a second common-source device and a second common-gate device;
   a first degenerative element or block provided for the first common-source device;
   a second degenerative element or block provided for the second common-source device;
   a first positive feedback block or element that connects a first gate of the first common-source device with a second drain of the second common-source device; and
   a second positive feedback block or element that connects a second gate of the second common-source device with a first drain of the first common-source device.

2. The system of claim 1, wherein each of the respective first and second degenerative elements or blocks comprises one or more inductive elements or resistive elements.

3. The system of claim 2, wherein each of the respective first and second degenerative elements or blocks comprises at least one inductive element in parallel with at least one resistive element.

4. The system of claim 1, wherein each of the respective first and second positive feedback blocks or elements includes one or more capacitive elements or active devices.

5. The system of claim 4, wherein each of the respective first and second positive feedback blocks or elements comprises at least one capacitive element in parallel with at least one active device.

6. The system of claim 4, wherein the at least one active device includes one or more transistors or switch elements.

7. The system of claim 1, wherein each of a pair of system differential inputs is received by a first gate of the first common-source device or a second gate of the second common-source device, wherein a first drain of the first common-gate device and a second drain of the second common-gate device provide respective differential outputs.

8. The system of claim 7, wherein the first and second drains are connected to a bias source.

9. The system of claim 7, further comprising a balun that converts the differential outputs into a single-ended signal that is taken as a system output.

10. The system of claim 1, wherein the first degenerative element is connected between a first source of the first common-source device and ground, and wherein the second degenerative element is connected between a second source of the second common-source device and ground.

11. A feedback method for a power amplifier system, comprising:
   cascoding a first common-source device with a first common-gate device to provide a first cascode stage;
   cascoding a second common-source device with a second common-gate device to provide a second cascode stage;
   providing first negative feedback to the first cascode stage via a first degenerative element or block connected to the first common-source device;
   providing second negative feedback to the second cascode stage via a second degenerative element or block connected to the second common-source device;
   providing first positive feedback by connecting a first gate of the first common-source device with a second drain of the second common-source device via a first positive feedback block or element; and providing second positive feedback by connecting a second gate of the second common-source device with a first drain of the first common-source device via a second positive feedback block or element.

12. The method of claim 11, wherein each of the respective first and second degenerative elements or blocks comprises one or more inductive elements or resistive elements.

13. The method of claim 12, wherein each of the respective first and second degenerative elements or blocks comprises at least one inductive element in parallel with at least one resistive element.

14. The method of claim 11, wherein each of the respective first and second positive feedback blocks or elements includes one or more capacitive elements or active devices.

15. The method of claim 14, wherein each of the respective first and second positive feedback blocks or elements comprises at least one capacitive element in parallel with at least one active device.

16. The method of claim 14, wherein the at least one active device includes one or more transistors or switch elements.

17. The method of claim 11, further comprising:
receiving each of a pair of system differential inputs by a first gate of the first common-source device or a second gate of the second common-source device, and
providing respective differential outputs at a first drain of the first common-gate device and a second drain of the second common-gate device.

18. The method of claim 17, further comprising connecting the first and second drains to a bias source.

19. The method of claim 17, further comprising converting, via balun, the differential outputs into a single-ended signal that is taken as a system output.

20. The method of claim 11, wherein the first degenerative element is connected between a first source of the first common-source device and ground, and wherein the second degenerative element is connected between a second source of the second common-source device and ground.

* * * * *